(12) United States Patent
Pardo

(10) Patent No.: US 8,120,133 B2
(45) Date of Patent: Feb. 21, 2012

(54) MICRO-ACTUATOR AND LOCKING SWITCH

(75) Inventor: Flavio Pardo, New Providence, NJ (US)

(73) Assignee: Alcatel Lucent, Paris (FR)

(*) Notice: Subject to any disclaimer, the term of this patent is extended or adjusted under 35 U.S.C. 154(b) by 1086 days.

(21) Appl. No.: 11/519,142

(22) Filed: Sep. 11, 2006

(65) Prior Publication Data

US 2008/0061387 A1    Mar. 13, 2008

(51) Int. Cl.
*H01L 29/12* (2006.01)
(52) U.S. Cl. ............................ 257/467; 257/E27.008
(58) Field of Classification Search .................. 257/467, 257/E27.008
See application file for complete search history.

(56) References Cited

U.S. PATENT DOCUMENTS

| 5,629,565 | A  | * | 5/1997 | Schlaak et al. | 257/780 |
| 6,245,246 | B1 | * | 6/2001 | Silverbrook    | 216/27  |
| 6,407,478 | B1 |   | 6/2002 | Wood et al.    | 310/307 |
| 6,739,132 | B2 |   | 5/2004 | Bromley et al. | 60/527  |
| 2003/0034870 | A1 | * | 2/2003 | Becka et al.  | 337/36  |
| 2003/0058069 | A1 | * | 3/2003 | Schwartz et al. | 335/78 |
| 2005/0002079 | A1 | * | 1/2005 | Novotny et al. | 359/245 |
| 2005/0206483 | A1 | * | 9/2005 | Pashby et al.  | 333/262 |

OTHER PUBLICATIONS

US 2002/0021053 A1 (Wood Robert L [US] et al) Feb. 21, 2002 cited in the application abstract; claims 36-38; figures paragraphs [0056]—[0058].
PCT International Search Report dated Sep. 7, 2007 (PCT/US2007/019526) 2 pages.
Vivek Agrawal, "A Latching MEMS Relay for DC and RF Applications", *Electrical Contacts, 2004. Proceedings of the 50th IEEE Holm Conference on Electrical Contacts and the 22nd International Conference on Electrical Contacts*, Sep. 22-23, 2004, pp. 222-225.

* cited by examiner

*Primary Examiner* — Allan R Wilson
(74) *Attorney, Agent, or Firm* — Eugene J. Rosenthal

(57) ABSTRACT

A micro-electromechanical actuator employs metal for the hot arm and silicon for at least the flexible portion of the cold arm. The cold arm made of silicon is coupled to a metal wire that moves with it and is used to carry the signal to be switched when at least two of such actuators are formed into a switch. Arrays of such switches on a first chip may be cooperatively arranged with a second chip that is flip-chip bonded to the first chip, the second chip having thereon wires routing the electrical control currents to the various hot arms for heating them as well as the signals to be switched by the various switches.

24 Claims, 6 Drawing Sheets

MICRO-ACTUATOR AND LOCKING SWITCH

TECHNICAL FIELD

This invention relates to micro-actuators that are especially useful for micro-switches such as relays, and more particularly, to arrays of locking micro-switches using such micro-actuators.

BACKGROUND OF THE INVENTION

Micro-electromechanical systems (MEMS) are very small movable mechanical structures built using standard semiconductor processes. MEMS can be arranged to function as actuators, which are useful in many applications. These actuators typically have a length of a few hundreds of microns, and oftentimes a width of only a few tens of microns. A MEMS actuator is usually configured and disposed in a cantilever fashion in that it has an end attached to a substrate and an opposite free end which is movable between at least two positions, one being a neutral position and the others being deflected positions.

One possible use for MEMS actuators is to configure them as switches. These switches may be locking switches, i.e., relays. These switches are made of at least one actuator. In the case of multiple actuators, they are operated in sequence so as to connect or release one of their parts to a similar part on the other, mating actuator. Because they are extremely small, a very large number of MEMS switches can be provided on a single chip.

MEMS switches have many advantages. Among other things, they can be inexpensive and, as noted, very small. Typically, their power consumption is minimal and their response time is extremely short, e.g., the complete sequence for closing or opening a MEMS switch may be only a few milliseconds.

Typical actuators are based on a pair of arms, one being the so-called "cold" arm, the other being the so-called "hot" arm, both being anchored to a layer on the substrate at one end and linked rigidly together at their opposite end. Note that the hot arm is typically an open end narrow wire loop that extends from two anchors at its open end to, at its closed end, about the end of the cold arm. Also, typically, the hot and cold arms are electrically isolated. The switch contact point is typically attached to the cold arm and located in the vicinity of the location at which the beams are linked.

The deflection of the arms is initiated by applying a potential difference between the pair of terminals, called "anchor pads", which anchors the hot arm to the substrate. This is the control signal for the actuator. The potential difference causes a current flow in the hot arm elevating its temperature by Joule heating. This heating ultimately causes a part of the hot arm to contract or elongate, depending on the material being used. Presently, the materials of choice for the hot arm are nickel alloys due to their large thermal expansion coefficient, reasonable electrical conductivity, and ease of fabrication by electroplating techniques. Given that the cold arm is not intentionally heated, and so should not change in size, the resulting differential in the size of the beams of the hot and cold arms, which were initially the same size before heating, produces a lateral displacement at the end where the arms are linked.

An actuator may have one or more hot arms, as well as one or more cold arms, depending on the design. Such actuators are arranged to form a switch that can be selectively opened and closed.

One exemplary such actuator is disclosed in U.S. Pat. No. 6,407,478 issued to Wood et al. on Jun. 18, 2002, incorporated by reference as if fully set forth herein. Wood et al. also discloses simplified switches and switching arrays that use micro-electromechanical devices that have one or more beam members that are responsive to temperature. For example, a micro-electromechanical device includes first and second beam members that have respective first ends connected to anchors, and that are also connected together, e.g., near their ends opposite to the anchors. By connecting them together, the first and second beam members thus form a loop. The first and second beam members are connected to a dielectric tether by a first tether anchor. The micro-electromechanical device further includes a third beam member that has a first end that is connected to an anchor and that is connected to the dielectric tether by a second tether anchor. At least one of the first and the second beam members are configured to elongate when the first and/or the second beam member is heated to a temperature that is greater than a temperature of the third beam member. Thus, the first and second beam members form the hot arm while the third beam member is the cold arm. By using two beam members to carry a control current to heat one or both of the two beam members, micro-electromechanical devices may electrically isolate a control signal path defined by the first and the second beam members from a load signal path defined by a third beam member. Such actuators are know in the art as a "heatuator".

A micro-electromechanical latching switch, i.e., a relay, may be formed using a pair of switch contacts attached to a substrate, and first and second actuators as described. The first actuator has a first end that is connected to the substrate, and has a contact connected thereto. The first actuator further includes a first tab that is attached to the contact. The first actuator is operable to deflect in response to an electrical current. The second actuator has a first end that is connected to the substrate and has a second tab that is connected thereto. The second actuator is operable to deflect in response to an electrical current. The first and the second actuators are positioned such that the contact electrically connects the pair of switch contacts when the first tab engages the second tab between the pair of switch contacts and the second tab. Furthermore, the contact does not electrically connect the pair of switch contacts when the second tab engages the first tab between the pair of switch contacts and the first tab. Arrays of such relays may likewise be formed on a single substrate.

See also Agrawal, *A Latching MEMS Relay for DC and RF Applications*, Published in IEEE Electrical Contacts, 2004, Proceedings of the 50th IEEE Holm Conference on Electrical Contacts and the 22nd International Conference on Electrical Contacts, pages 222-225, 20-23 Sep. 2004 having ISBN: 0-7803-8460-1, INSPEC Accession Number: 8291957, and Digital Object Identifier: 10.1109/HOLM.2004.1353121 and was posted online: 2004-11-08 17:30:48.0, which is also incorporated by reference as if set forth fully herein.

U.S. Pat. No. 6,407,478 issued to Menard et al. on May 2, 2006, which is incorporated by reference as if fully set forth herein, discloses a MEMS cantilever actuator mounted on a substrate, the actuator including an elongated hot arm member having two spaced-apart portions, each provided at one end with a corresponding anchor pad connected to the substrate, the portions being connected together at a common end that is opposite the anchor pads; an elongated cold arm member adjacent and substantially parallel to the hot arm member, the cold arm member having at one end an anchor pad connected to the substrate, and a free end that is opposite the anchor pad thereof; and a dielectric tether attached over the common end of the portions of the hot arm member and the free end of the cold arm member to mechanically couple the hot arm member and the cold arm member and keep them electrically independent.

The various elements of the actuators employed in an array of switches, as well as the signals to be switched, are typically routed in wires of a layer formed on the substrate but below the layers in which the actuators are formed. As a result, the actuators must be formed of materials the processing of which will not destroy the wires. Unfortunately, high temperature processes will destroy such wires. Hence, low temperature processing is typically employed, and thus the hot and cold arms of the actuator are typically formed of metal, e.g., nickel, e.g., using well-known molding and plating techniques, e.g., as described in the Agrawal paper.

Metal has good conductive properties, and hence is suitable to be used as the electrical conductor for signals to be switched by such a switch. Also, the thermal expansion of metal is relatively high, making it deflect strongly upon heating, and hence being very suitable for use as the hot arm. However, disadvantageously, metal suffers from so-called "creep", meaning failure of the restorative force properties of the metal to return it to its original shape when the force upon the metal that distorted its shape is removed.

By contrast, silicon does not suffer from creep, but it has relatively high resistance, making it unsuitable to be used as the electrical conductor for signals to be switched by such a switch. Furthermore, silicon requires high temperatures for processing to form elements therefrom, such high temperature processing being inimicable to the underlying wires. Lastly, the thermal expansion of silicon is relatively limited as compared to that of metal, in that silicon does not deflect as strongly as a typically employed metal would upon heating, and hence silicon is relatively unsuitable for use as the hot arm.

SUMMARY OF THE INVENTION

Given the foregoing, I have recognized that a micro-electromechanical actuator that avoids the limitations of such prior art actuators may be made, in accordance with the principles of the invention, by employing metal for the hot arm and silicon for at least the flexible portion of the cold arm. In accordance with an aspect of the invention, the cold arm made of silicon is coupled to a metal wire that moves with it and is used to carry the signal to be switched when at least two of such actuators are formed into a switch. In accordance with a further principle of the invention, arrays of such switches on a first chip may be cooperatively arranged with a second chip that is flip-chip bonded to the first chip, the second chip having thereon wires routing the electrical control currents to the various hot arms for heating them as well as the signals to be switched by the various switches.

Advantageously, when appropriately designed, e.g., such that the hot arm provides sufficient force to bend the cold arm when the hot arm is heated, yet is soft enough to not impede restoration of the cold arm to its initial position when the hot arm cools, such an actuator does not suffer from creep, due to the restorative force provided by the silicon is essentially unchanging over time. Further advantageously, the high temperature processing of the silicon, which is only need to form the cold arm, is isolated from the processing of the metal used in the switch because 1) the conductors for routing the electrical control currents to the various hot arms for heating them as well as the signals to be switched by the various switches are on the second chip which is independently fabricated, and 2) any wires on the first chip, such as the wires making up each hot arm and each wire coupled to the cold arm and carrying the signal to be switched, can be manufactured on the first chip after the silicon processing is complete. Further advantageously, use of a wire associated with the cold arm, but not the cold arm itself, to carry the signal to be switched, allows the cold arm to be made of silicon, thereby eliminating creep, while yet allowing the signal wire to have low impedance.

DETAILED DESCRIPTION

Figure 1:
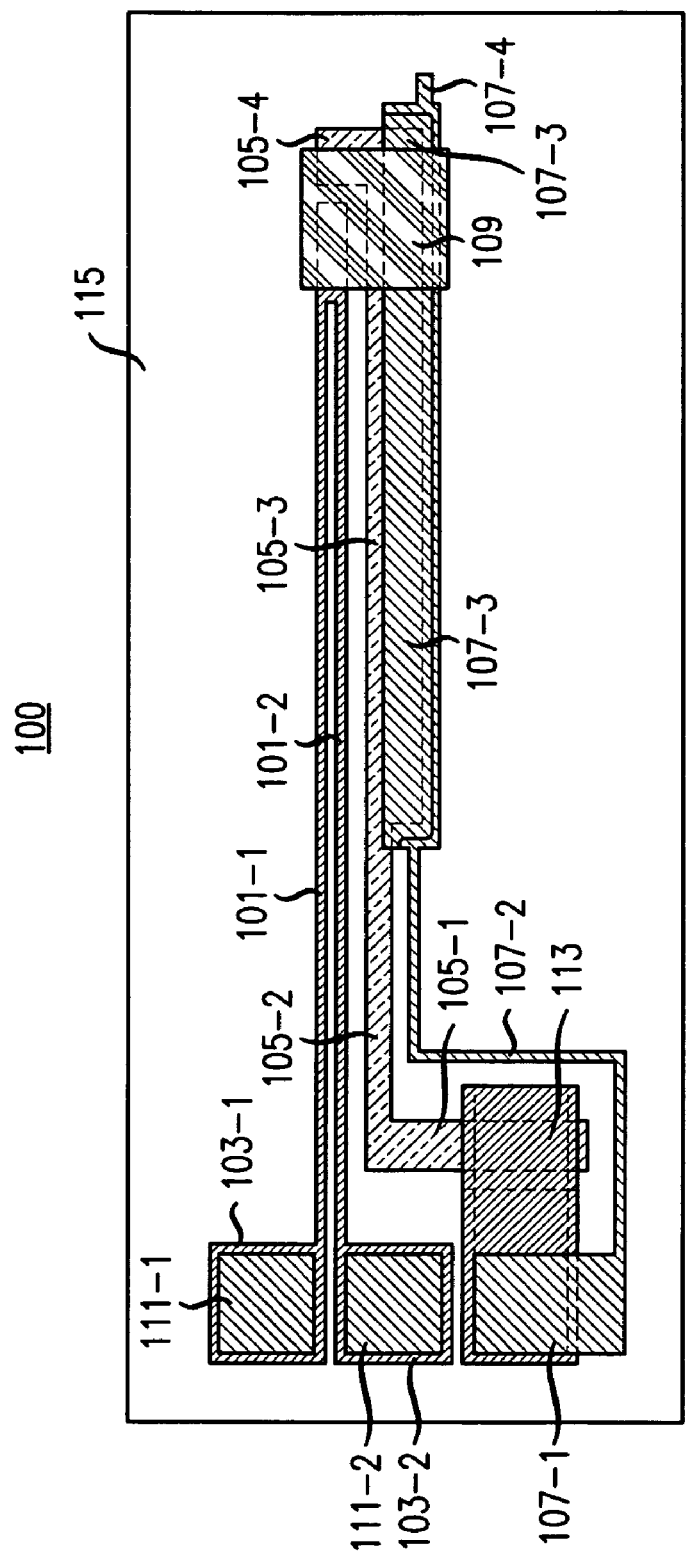
FIG. 1 shows a top view of one chip used to form exemplary MEMS actuator that employs metal for its hot arm and silicon for at least a flexible portion of its cold arm, in accordance with the principles of the invention.

The following merely illustrates the principles of the invention. It will thus be appreciated that those skilled in the art will be able to devise various arrangements that, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function. This may include, for example, a) a combination of electrical or mechanical elements which performs that function or b) software in any form, including, therefore, firmware, microcode or the like, combined with appropriate circuitry for executing that software to perform the function, as well as mechanical elements coupled to software controlled circuitry, if any. The invention as defined by such claims resides in the fact that the functionalities provided by the various recited means are combined and brought together in the manner which the claims call for. Applicant thus regards any means which can provide those functionalities as equivalent as those shown herein.

Unless otherwise explicitly specified herein, the drawings are not drawn to scale.

The term micro-electromechanical systems (MEMS) device as used herein is intended to mean an entire MEMS device or any portion thereof. Thus, if a portion of a MEMS device is inoperative, or if a portion of a MEMS device is occluded, such a MEMS device is nonetheless considered to be a MEMS device for purposes of the present disclosure.

In the description, identically numbered components within different ones of the FIGs. refer to the same components.

FIG. 1 shows a top view of one chip used to form exemplary MEMS actuator 100 that employs metal for its hot arm and silicon for at least a flexible portion of its cold arm, in accordance with the principles of the invention. Furthermore, in accordance with an aspect of the invention, the cold arm made of silicon is coupled to a metal wire that moves with it and is used to carry the signal to be switched when the at least two of such actuators are formed into a switch. Shown in FIG. 1 is exemplary MEMS actuator 100 made up of a) hot arm 101, b) hot arm anchors 103, c) cold arm 105, d) metal signal wire 107, e) dielectric tether 109, f) underbump metallization pads 111, g) cold arm anchor 113, and h) chip 115.

In accordance with an aspect of the invention, hot arm 101 is a metal wire that heats when current is passed through it. Typically, hot arm 101 is formed of a nickel-based metal, although other materials may be used. When heated, nickel-based metals tend to elongate, although other materials may be employed which contract rather than elongate. Conceptually, hot arm 101 includes two portions 101-1 and 101-2 that meet in the vicinity of dielectric tether 109. Note that hot arm 101 may be made of a single continuous piece of metal or of various segments. Hot arm 101 is designed so that it provides sufficient force to bend cold arm 105 when hot arm 101 is heated, yet is soft enough to not impede restoration of cold arm 105 to its initial position when hot arm 101 cools.

Hot arm portion 101-1 is coupled to hot arm anchor 103-1, and similarly, hot arm portion 101-2 is coupled to hot arm anchor 103-2. Hot arm anchors 103 anchors hot arm 101 to a layer of the chip 115 while leaving hot arm 101 free to move. Hot arm anchors 103 are typically made of the same material that is used to make hot arm 101, e.g., a nickel-based material. Underbump metallization pads 111 are made of a material that bonds well to hot anchors 103 and to solder, since the current to heat hot arm 101 is supplied via underbump metallization pads 111 and hot arm anchors 103 to hot arm 101 from control wires on to a second chip that is carrying control and signal wires (not shown) and will be flip-chip bonded using solder bumps on anchors 111 and 113 to chip 115.

Cold arm 105 conceptually has four potential portions. Cold arm portion 105-1 is a support that is used to anchor cold arm 105 to chip 115 is formed. Although cold arm 105 must have some portion of it that anchors it to chip 115, it need not be positioned and shaped as is cold arm portion 105, as will be readily recognized by those of ordinary skill in the art. Flexible cold arm portion 105-2 is the flexible portion of cold arm 105. In accordance with an aspect of the invention, flexible cold arm portion 105-2 is made of silicon thereby, advantageously, eliminating the problem of creep of prior art actuators.

Optional rigid cold arm portion 105-3 is the rigid portion of cold arm 105 and preferably its width is also used to allow the portion of signal wire 107 that is deposited thereon to be wider, and hence have lower resistance. Note that flexible cold arm portion 105-2 could continue until dielectric tether 109 in the absence of rigid cold arm portion 105-3.

Head end cold arm portion 105-4 is that portion of cold arm 105 to which dielectric tether 109 is attached for purposes of coupling cold arm 105 to hot arm 101. Head end cold arm portion 105-4 is shaped in the manner shown in FIG. 1, which is commonly used in prior art actuators to reduce the reliance on the shear strength of dielectric tether 109 and to better couple the change in length of hot arm 103 into displacement of cold arm 105.

Metal signal wire 107 is used to carry the signal to be switched by a switch incorporating actuator 100. Preferably, metal signal wire 107 is highly conductive, and may be made of any well-known conductive metal, e.g., gold, or metal alloys. Metal signal wire 107 may be made of different segments that have different conductivities, and may even be different materials.

Metal signal wire 107 is conceptually made up of four potential segments: underbump metallization pad segment 107-1, free standing segment 107-2, cold arm mounted segment 107-3, and tip segment 107-4. Underbump metallization pad segment 107-1 is used to anchor free connective segment 107-2 of metal signal wire 107 to cold arm anchor 113. Metallization pad 107 is further used as a connector on which a solder bump is placed to connect signal wire 107 to the second chip that is carrying control and signal wires (not shown).

Tip segment 107-4 is used to controllably conductively couple metal signal wire 107 to the corresponding metal signal wire of another actuator (not shown) when actuator 100 is part of a switch. When the switch is closed, the tips of each actuator are in contact. When the switch is open, the tips of each actuator are separated. Tip segment 107-4 may be formed fully on, fully off, or partly one and partly off of cold arm 105.

Free standing segment 107-2 and cold arm mounted segment 107-3 are used to connect underbump metallization pad segment 107-1 to tip segment 107-4. Free standing segment 107-2 should be formed with properties so as to not impact upon the flexing and restoration movements of cold arm flexible portion 105-2. As will be readily recognized by those of ordinary skill in the art, not only the choice of material and its dimensions may be designed to insure that free standing segment 107-2 does not impact upon the flexing and restoration movements of cold arm flexible portion 105-2, but also its shape. Thus, for example, free standing segment 107-2 may be shaped at least in part as a spring. Note that free standing segment 107-2 could itself be mounted on cold arm flexible portion 105-2, but this is less desirable as it is likely that the free standing segment 107-2 will impact to some extent the flexing and restoration movements of cold arm flexible portion 105-2

Cold arm mounted segment 107-3 electrically connects free-standing segment 107-2 and tip segment 107-4. The extent to which cold arm mounted segment 107-3 covers the width of rigid cold arm portion 105-3 is at the discretion of the implementer, as is its height and the material chosen. In fact, cold arm mounted segment 107-3 may even extend over the edge of rigid cold arm portion 105-3, in the manner shown in FIG. 1. If so, it may extend down the sidewall of cold arm 105 over which it extends.

Dielectric tether 109 is a conventional tether made of a dielectric, i.e., nonconducting material that couples the hot and cold arms together. For example, dielectric tether 109 may be made out of polyimide, photosensitive epoxy such as MicroChem Corporation's SU8, or benzocyclobutene (BCB).

Although it could be made of silicon, cold arm anchor 113 is preferably made of the same material as are hot anchors 103. Note that hot and cold anchors are typically formed at the same time. However, since when the material for the cold arm support portion 105-1 is already formed when the material for hot anchors 103 and cold anchor 113 is deposited, that part of cold anchor 113 which is over cold arm support portion 105-1 will be higher than the other portions of cold anchor 113 and hot anchors 103.

The wafer on which chip 115 is formed is typically a silicon on insulator (SOI) type of wafer. An exemplary SOI wafer is made of three layers. The first layer is a so-called "handle" wafer layer, which is silicon. This can be seen in FIG. 2 as silicon wafer layer 253. The second layer, a buried oxide layer (BOX), which is also known as the "sacrificial layer", is an insulator. The third layer, the "mechanical" layer, is also silicon, although it a) is typically much thinner than handle wafer layer and b) may be referred to as the device layer. It is the silicon of the device layer from which cold arm 105 (FIG. 1) is formed by etching. Hot arm 101, hot anchors 103, and cold anchor 113 are formed on the sacrificial layer after the device layer has been etched away to leave cold arm 105. After formation of the remaining structures, the sacrificial layer is etched away almost everywhere, freeing hot arm 101 and cold arm 105 to move. However, by using a proper size for hot anchors 103 and cold anchor 113 at least some of the oxide below them remains, keeping the anchors firmly connected to the handle wafer. These remains can be seen in FIG. 2, e.g., anchor oxide portions 253 and 255.

Figure 2:
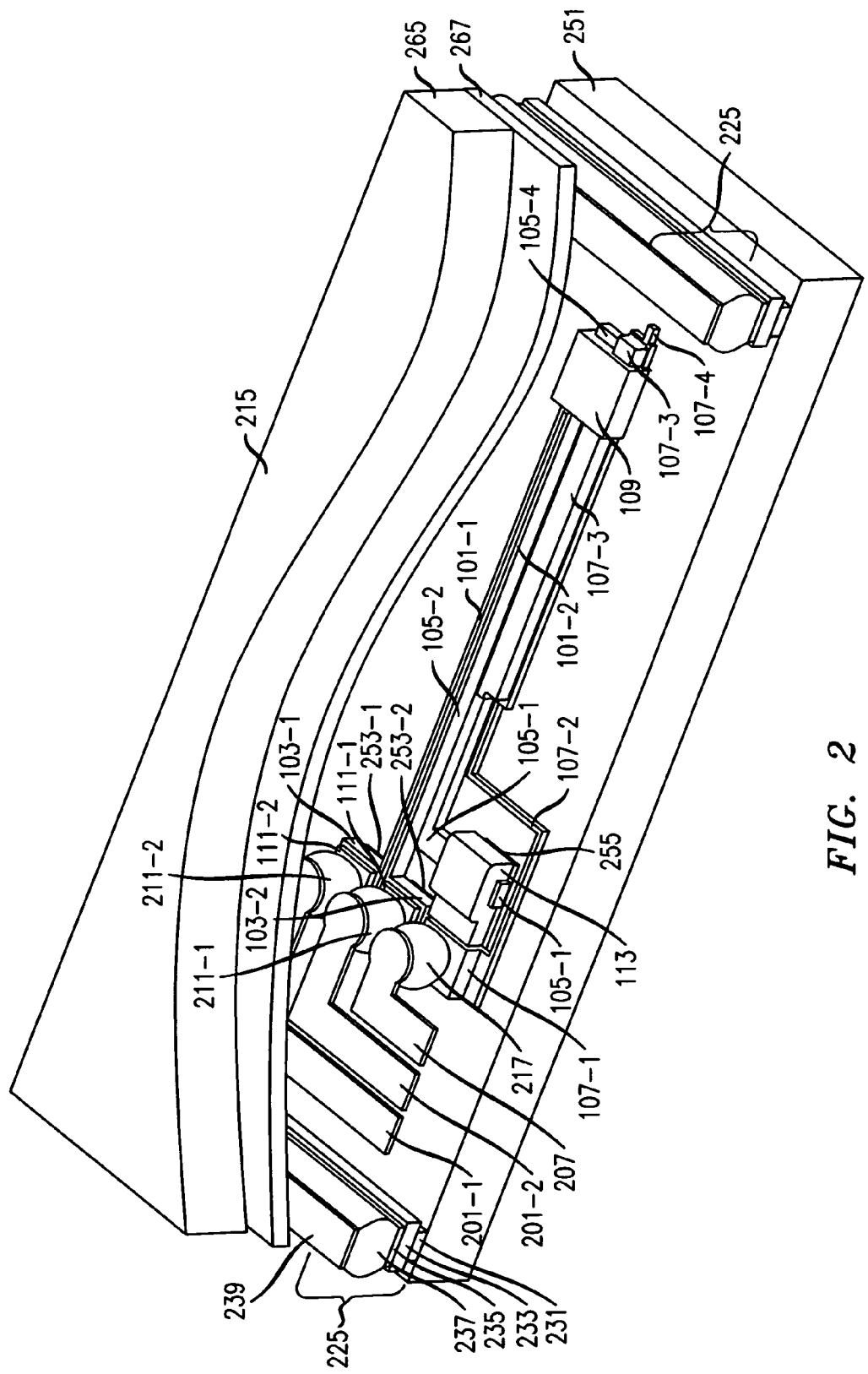
FIG. 2 shows a three-dimensional perspective view of an exemplary second chip that is flip-chip mounted to the chip of FIG. 1 and electrically coupled to the MEMS actuator of FIG. 1, in accordance with the principles of the invention.

In accordance with a further principle of the invention, arrays of switches made of actuators such as MEMS actuator 100 (FIG. 1) on chip 115 may be cooperatively arranged with a second chip that is flip-chip bonded to the first chip, the second chip having thereon wires routing the electrical control currents to the various hot arms for heating them as well as the signals to be switched by the various switches. FIG. 2 shows a three-dimensional perspective view of exemplary second chip 215 flip-chip mounted to chip 115 and electrically coupled to MEMS actuator 100, in accordance with the principles of the invention. In addition to the those elements of FIG. 1 that are visible in FIG. 2, also shown are 1) wires 201-1 and 201-2, 2) solder bumps 211-1 and 211-2, 3) wire 207, 4) solder bump 217 electrically connecting wire 207 to metal signal wire 105, 5) solder sealing walls 225, 6) second chip 215, 7) second chip interconnect layers 267 and 8) anchor oxide portions 253 and 255. Note that in FIG. 2, for pedagogical purposes, a portion of second chip 215 has been removed to improve visibility. In particular, a portion of interconnect layers 267 has been removed and an even greater portion of substrate 265 has been removed.

Wires 201-1 and 201-2 have between them a potential difference that is supplied across hot arm 101 to heat it. To this end, solder bumps 211-1 and 211-2 electrically connect wires 201-1 and 201-2 to hot arm portions 101-1 and 101-2, respectively, via underbump metallization pads 111, which facilitate the connection of solder bumps 211 to hot anchors 103 and ultimately hot arm 101. Wires 201 are made from metals that have reasonably high conductivity, e.g., aluminum, copper, and gold.

Similarly, wire 207 carries a signal to be supplied to metal signal wire 107 that is to be switched if actuator 101 is incorporated in a switch. Solder bump 217 electrically connects wire 207 to metal signal wire 107, e.g., at the location of underbump metallization pad segment 107-1. Wire 207, similar to wires 201 are made from metals that have reasonably high conductivity, e.g., aluminum, copper, and gold.

Note that wires 201 and wire 207 may be in the same layer or different layers on chip 215, depending on routing needs. Chip 215 is shown as being made up of substrate layer.

Solder sealing walls 225 are used to connect chip 215 to chip 115 so as to isolate the structures on the chip from the outside and enable packaging of the entire flip-chip. Note that solder sealing walls 225 shown in FIG. 2 are primarily for pedagogical purposes, in that solder sealing walls typically extend around the periphery of an entire chip, which typically includes and array of actuators arranged as switches and possible other devices as well, rather than around a mere single actuator. Further note that even if a single actuator such as shown in FIG. 2 were to be enclosed by solder sealing walls, the front sealing wall is not shown in FIG. 2 in order to be able to view the actuator, and the rear wall is blocked from view by chip 215. Solder sealing walls 225 may have the same structure as hot anchors 103, with the same layers of underbump metallization, solder, and a wire on top. Thus, solder sealing walls 225 includes a) oxide layer wall 231, b) nickel layer wall 233, c) underbump metallization, e.g., gold, layer wall 235, d) solder layer wall 237, e) wire layer wall 239.

Anchor oxide portions 253 is that portion of the oxide of chip 115 that was not etched away from the sacrificial layer and hence remains to keep hot anchors 101 firmly connected to handle wafer 251. Similarly, oxide portion 255 remains beneath cold arm anchor 113 to keep cold anchor 113, and cold arm 105, firmly connected to handle wafer 251. Likewise, oxide layer wall 231 is formed from the oxide of the sacrificial layer and remains after the rest of the sacrificial layer has been etched away elsewhere.

Second chip 215 is made up of substrate 265 and interconnect layers 267. Substrate 265 is typically silicon. Interconnect layers 267 are made up of various layers that form the various wires that are wires 201 and 207. Typically a layer of insulator is deposited on silicon substrate 265, and then at least one layer of wires is formed upon the insulating layer. Additional layers of insulator and wires may be deposited alternately, with electrical connections between wires at different layers being established using vias in the conventional manner.

Figure 3:
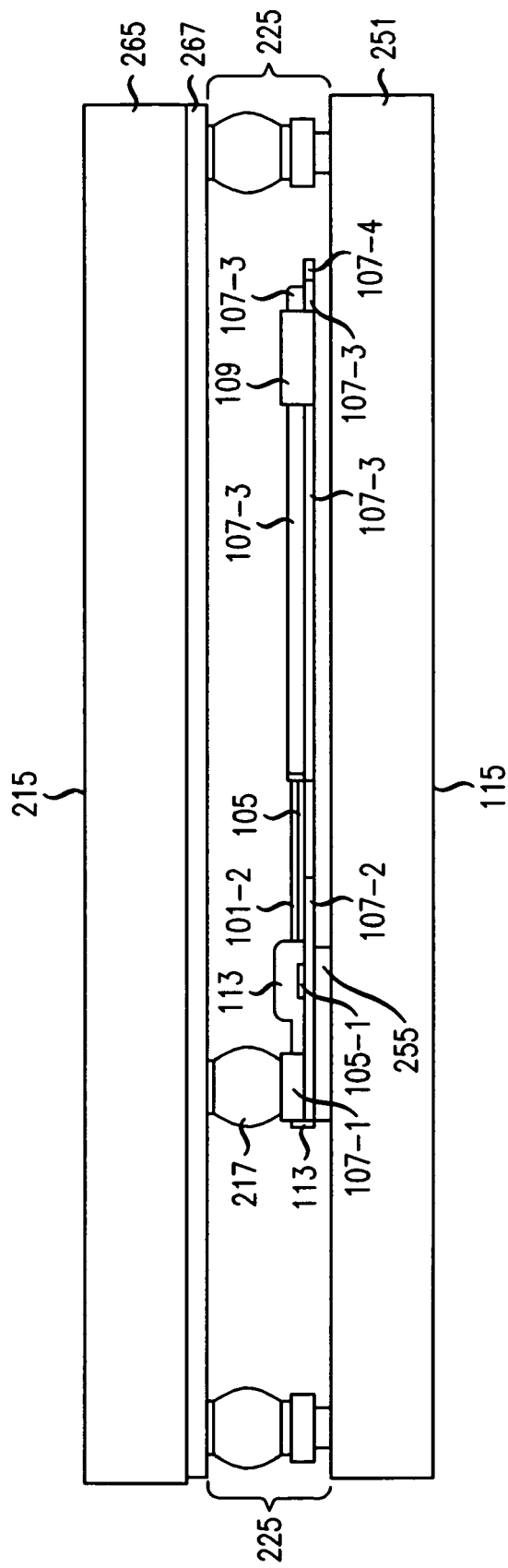
FIG. 3 shows a side view of an exemplary second chip that is flip-chip mounted to the chip of FIG. 1 and electrically coupled to the MEMS actuator of FIG. 1, in accordance with the principles of the invention.

FIG. 3 shows a side view of exemplary MEMS actuator 100 including second chip 215 flip-chip mounted to chip 115 and electrically coupled to MEMS actuator 100, as was shown in FIG. 2. No new components are introduced, however, some elements that were perhaps somewhat difficult to perceive their full extent from the view of FIG. 2 are more easily seen in FIG. 3.

Figure 4:
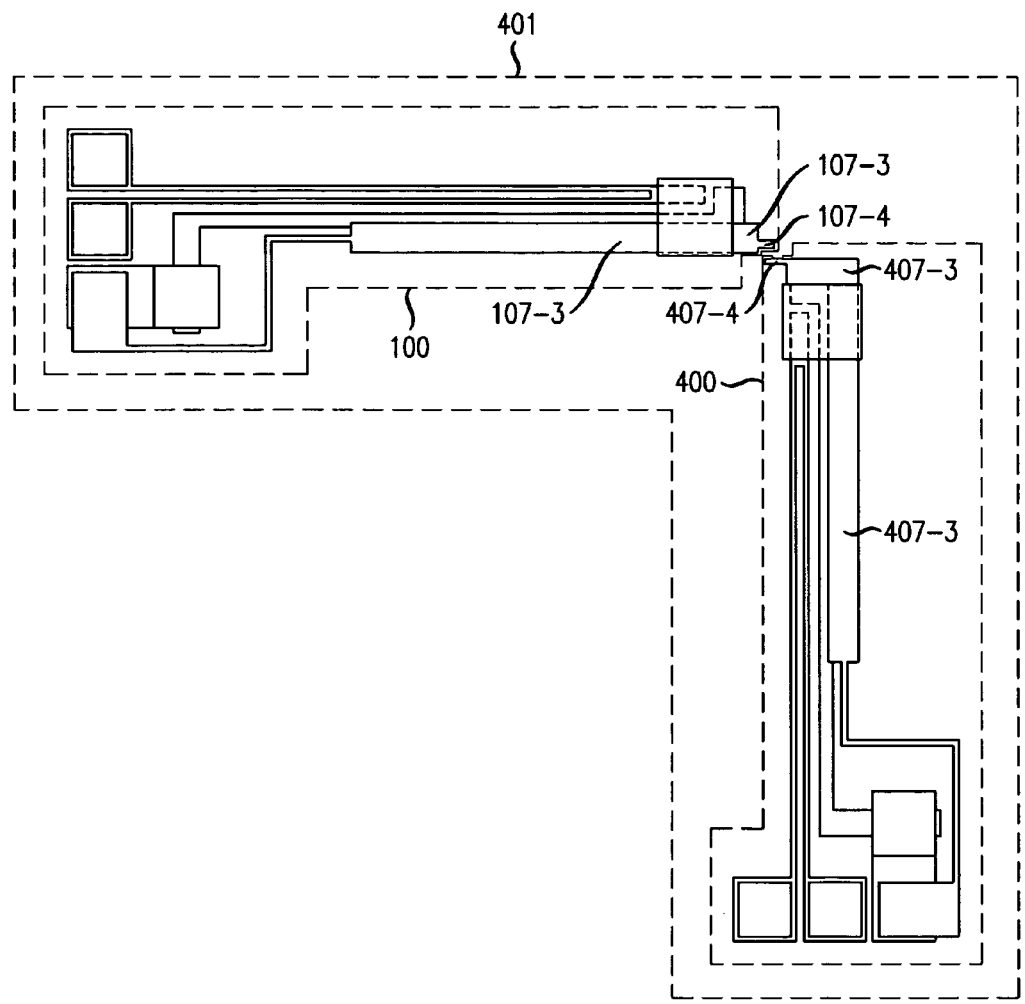
FIG. 4 shows a top view of two actuators used to form a switch.

FIG. 4 shows a top view of two actuators used to form switch 401, e.g., a locking switch which is also known as a relay. The first actuator is exemplary MEMS actuator 100 as shown in FIG. 1. The second actuator is exemplary MEMS actuator 400 which is identical to exemplary MEMS actuator 100 as shown in FIG. 1 except that a) tip segment 107-4 has been replaced by perpendicularly pointed tip segment 407-4 and b) cold arm mounted segment 107-3 has been replaced with cold arm mounted segment 407-3 which is nearly identical to cold arm mounted segment 107-3 but which continues along head end cold arm portion 105-4 to tip segment 407-4. Those of ordinary skill in the art will readily recognize that different types of tips may be employed.

Figure 5:
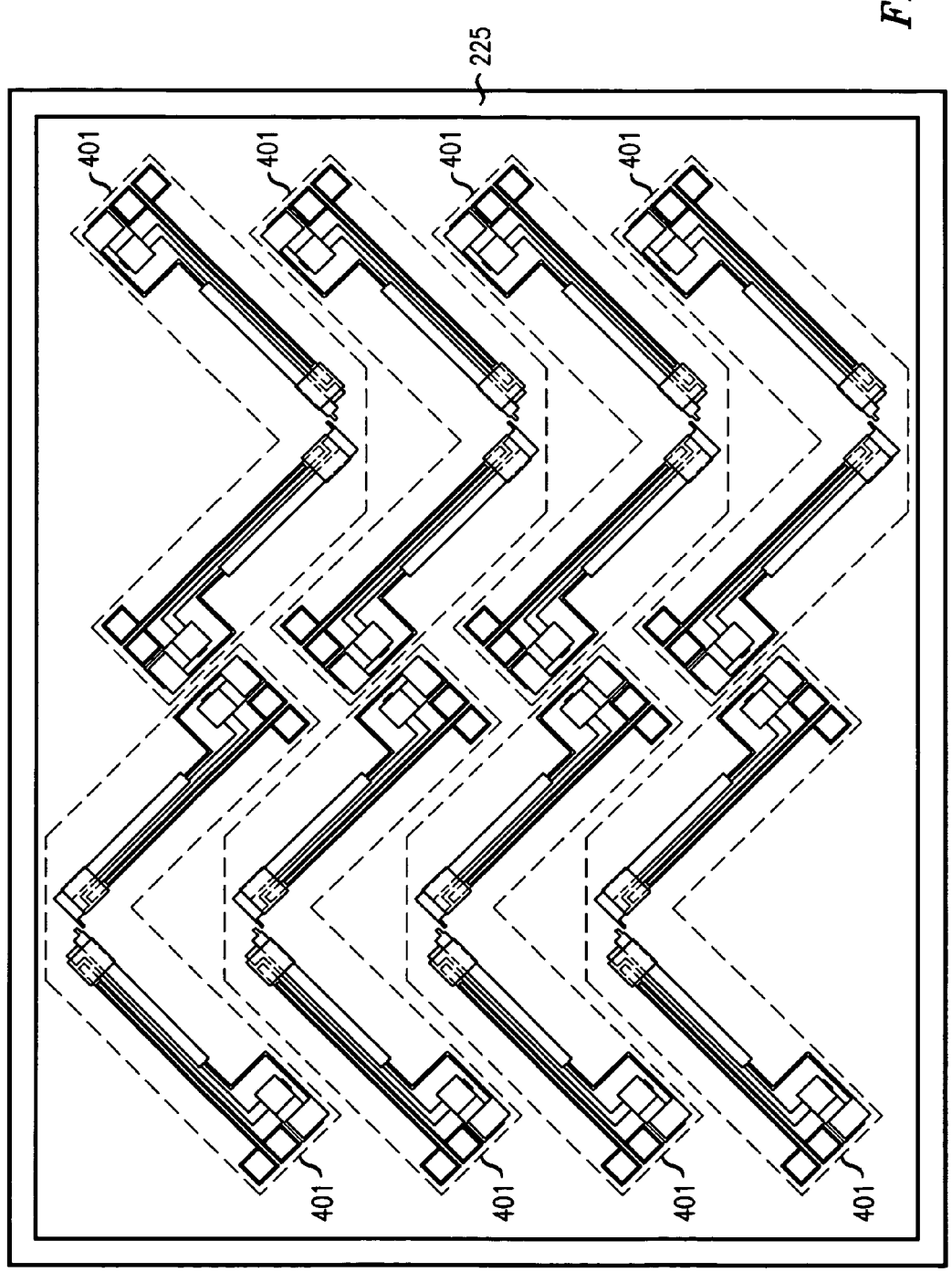
FIG. 5 shows an array of the switch of FIG. 4 formed on a single chip.

FIG. 5 shows an array of switches 401 formed on a single chip. Such an array is suitable for use as cross-connect in telecommunications applications. Note that the control signals for the hot arms of the various actuators as well as the signals to be switched are supplied from a top chip such as top chip 215 (FIG. 2 and FIG. 3). Also note that, in FIG. 5, solder sealing walls 225 extends around the entire perimeter of the chip, rather than around any single actuator, as mentioned hereinabove.

Figure 6:
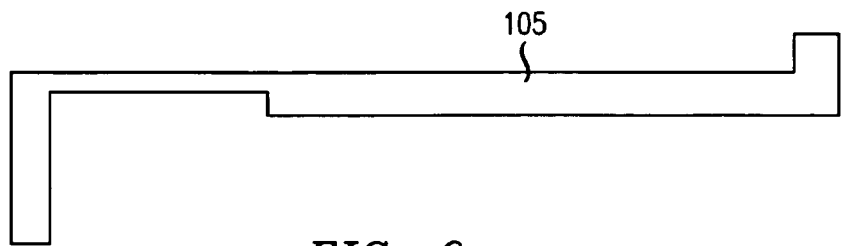
FIGS. 6-9 each shows a top view after one of the various processes are performed to form the exemplary MEMS actuator of FIG. 1.
Figure 7:
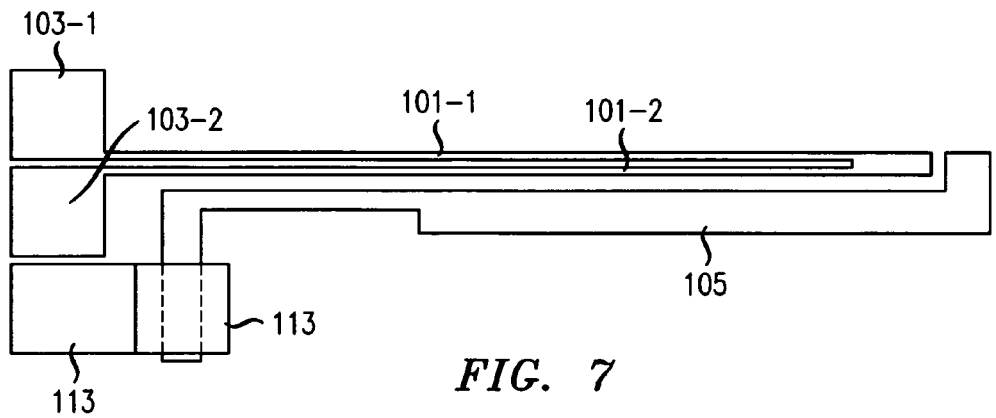

FIGS. 6-9 each shows a top view after one of the various processes are performed to form exemplary MEMS actuator 100 of FIG. 1 in accordance with an exemplary method for forming MEMS actuator 100. FIG. 6 shows the result after forming cold arm 105. Cold arm 105 is formed by appropriately patterning and etching an SOI wafer to leave the desired shape of cold arm 105 in the device layer, as will be readily understood by one of ordinary skill in the art. FIG. 7 shows the result after forming hot arm 101, hot arm anchors 103, and cold arm anchor 113. One way in which these structures may be formed is by 1) depositing a seed layer of metal over the surface of the chip; 2) depositing and patterning a photoresist mold that has openings therein where it is desired that the metal should grow; and 3) electroplating the chip by a) attaching an electrode to the seed layer and to a bath containing the metal to be grown, b) depositing the chip in the bath, and c) passing a current between the bath and the seed layer. Another technique that may be used in conjunction with a photoresist mold is so-called "electroless" plating.

Figure 8:
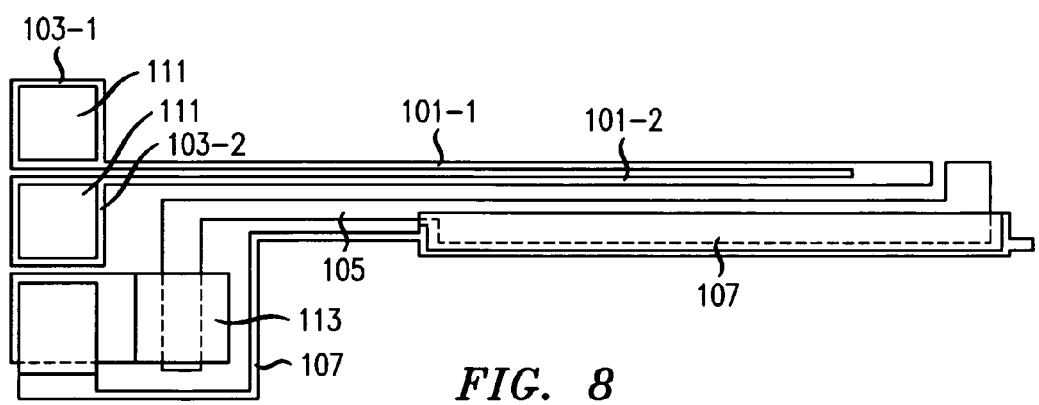

FIG. 8 shows the result after forming metal signal wire 107 and underbump metallization pads 111. These structures may be formed using molding and electroplating as described in connection with FIG. 7, but using the metal and electroplating bath and current appropriate to metal signal wire 107 and underbump metallization pads 111. Similarly, if available for the metal being used for metal signal wire 107 and underbump metallization pads 111, "electroless" plating may be employed.

Figure 9:
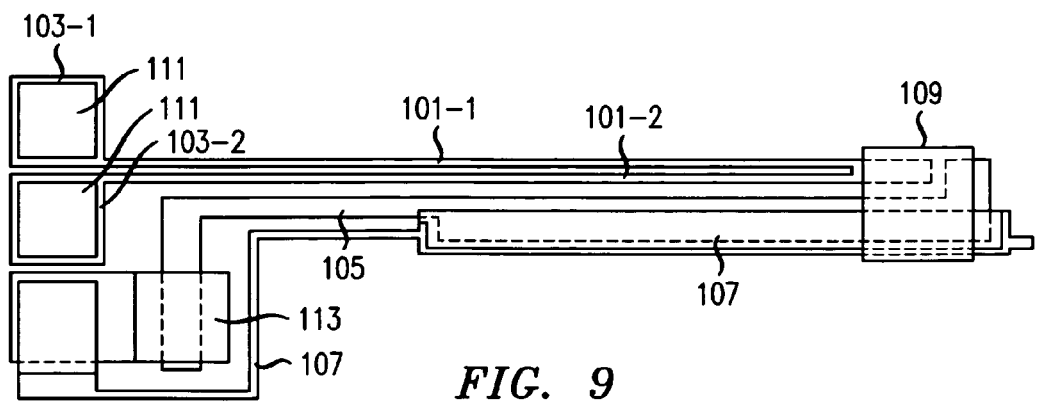

FIG. 9 shows the result after forming dielectric tether 109. Dielectric tether 109 is preferably formed by spinning a layer of a photosensitive dielectric over the chip, shining light where you want dielectric tether to be formed to change its chemical structure so that it is not sensitive to a developer, and bathing the chip in a developer to remove those portions of the dielectric material that were not exposed to light.

The final step is the release step. During the release step, the chip undergoes a time etch, in that it is bathed in an etching bath, typically hydrofluoric acid (HF), for a prescribed amount of time. Doing so etches away most of the remaining oxide layer of the original wafer. However, because the etch is of a prescribed duration, and there are area that are difficult for the etchant to reach, such as beneath hot anchors 103, cold anchor 113, and solder sealing walls 225 (FIGS. 2 and 5, not shown in FIGS. 6-9), oxide remains to keep those structures firmly bound to the chip substrate.

What is claimed is:

1. Apparatus comprising a first micro-electromechanical actuator, comprising:
    a first hot arm fabricated at least in part of metal; and
    a first cold arm having a flexible portion, said flexible portion being fabricated of silicon, said first cold arm being coupled to said first hot arm;
    wherein, when said first hot arm and said first cold arm are displaced from their rest positions due to heating of said first hot arm, after said heating of said first hot arm stops said first cold arm provides all of the restoring force to return said first hot arm and first cold arm to their rest positions and said first hot arm provides none of said restoring force.

2. The invention as defined in claim 1 wherein said first cold arm is coupled to said first hot arm so that when said hot arm is heated and changes its shape said cold arm displaces from its rest position.

3. The invention as defined in claim 2 wherein said cold arm is coupled to a substrate at one end of said cold arm and said cold arm is coupled to said hot arm at the other end of said cold arm.

4. The invention as defined in claim 1 wherein said first hot arm is shaped substantially as an open loop.

5. The invention as defined in claim 1 wherein any remaining portion of said first cold arm other than said flexible portion is rigid.

6. The invention as defined in claim 1 wherein said actuator further comprises a metal wire coupled to said cold arm.

7. The invention as defined in claim 6 wherein said metal wire is adapted to move congruently with said cold arm.

8. The invention as defined in claim 6 wherein said metal wire provides essentially no restoring force when moved from its rest position.

9. The invention as defined in claim 6 wherein said actuator is part of a switch and said metal wire is adapted to carry a signal to be switched by said switch.

10. The invention as defined in claim 6 wherein said metal wire is mounted at least in part on said cold arm.

11. The invention as defined in claim 10 wherein said metal wire is not mounted on said flexible portion of said cold arm.

12. The invention as defined in claim 1 wherein said first cold arm is coupled to said first hot arm so that when said hot arm is heated and changes its shape said cold arm displaces from its rest position.

13. The invention as defined in claim 1 wherein said first actuator further comprises a first metal wire coupled to said first cold arm, and wherein said apparatus is part of a switch further comprising:
    a second micro-electromechanical actuator, comprising:
        a second hot arm fabricated at least in part of metal;
        a second cold arm having a flexible portion, said flexible portion being fabricated of silicon, said second cold arm being coupled to said second hot arm;
        wherein, when said second hot arm and said second cold arm are displaced from their rest positions due to heating of said second hot arm, after said heating of said second hot arm stops said second cold arm provides all of the restoring force to return said second hot arm and second cold arm to their rest positions and said second hot arm provides none of said restoring force; and
    a second metal wire coupled to said second cold arm;
    said first and second micro-electromechanical actuators being arranged such that said first and second metal wires can be maintained in at least one position in which they are in electrical contact and in another position in which they are not in electrical contact.

14. The invention as defined in claim 13 wherein said first and second actuators are fabricated on a first chip, and said apparatus further comprises:
    a second chip flip-chip mounted to said first chip, said second chip comprising (i) a plurality of control wires and (ii) a plurality of signal wires coupled respectively to at least (i) said first and second hot arms and (ii) said first and second wires on said first chip.

15. The invention as defined in claim 14 wherein said each of said plurality of control wires is arranged to provide a conductive path for current for heating a respective one of said first and second hot arms.

16. The invention as defined in claim 14 wherein said each of said plurality of signal wires is arranged to provide a conductive path for a signal which is controllably switched on said first chip by said switch.

17. The invention as defined in claim 16 wherein each of said signal wires is coupled to a respective one of said first and second metal wires on said first chip.

18. The invention as defined in claim 14 further comprising a solder sealing wall at least mechanically coupling said first chip to said second chip.

19. Apparatus comprising a first micro-electromechanical actuator on a chip, comprising:
    silicon flexible means, said silicon flexible means having one end immovably coupled to a chip and having an opposite end free to move, said free to move end having a rest position; and
    means electrically isolated from said silicon flexible means for displacing said silicon flexible means;
    wherein, said silicon flexible means is adapted to supply a restoring force to restore to said rest position said free to move end of said silicon flexible means after said means electrically isolated from said silicon flexible means displaces said free to move end of said silicon flexible means; and
    wherein said means for displacing provides essentially no restoring force.

20. The invention as defined in claim 1 wherein said flexible portion of said first cold arm which is fabricated of silicon is fabricated of silicon of an SOI wafer device layer.

21. The invention as defined in claim 19 further comprising conductive means coupled to said silicon flexible means so that at least a portion of said conductive means is displaced when said silicon flexible means is displaced.

22. The invention as defined in claim 19 wherein said means for displacing comprises:
    means responsive to a supplied electric control signal for changing shape; and
    means for physically, but not electrically, coupling said means for displacing to said flexible means.

23. The invention as defined in claim 22 wherein said means for changing shape at least changes its length in response to said supplied electric control signal.

24. The invention as defined in claim 19 wherein said silicon flexible means is fabricated of silicon of an SOI wafer device layer.

* * * * *